(12) United States Patent
Kinoshita et al.

(10) Patent No.: US 9,753,274 B2
(45) Date of Patent: Sep. 5, 2017

(54) DISPLAY ELEMENT, PHOTOSENSITIVE COMPOSITION AND ELECTROWETTING DISPLAY

(71) Applicant: JSR CORPORATION, Minato-ku (JP)

(72) Inventors: Yoshinori Kinoshita, Minato-ku (JP); Toshiharu Araki, Minato-ku (JP); Kazunari Kudou, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 14/892,759

(22) PCT Filed: Jan. 8, 2015

(86) PCT No.: PCT/JP2015/050378
§ 371 (c)(1),
(2) Date: Nov. 20, 2015

(87) PCT Pub. No.: WO2016/017191
PCT Pub. Date: Feb. 4, 2016

(65) Prior Publication Data
US 2016/0178893 A1 Jun. 23, 2016

(30) Foreign Application Priority Data
Jul. 31, 2014 (JP) .................. 2014-156908

(51) Int. Cl.
*G02B 26/00* (2006.01)
*G02F 1/03* (2006.01)
(Continued)

(52) U.S. Cl.
CPC .......... *G02B 26/005* (2013.01); *G03F 7/032* (2013.01); *G03F 7/033* (2013.01); *G03F 7/037* (2013.01);
(Continued)

(58) Field of Classification Search
CPC ... G02F 1/133; G02F 1/29; G02F 1/01; G02F 1/03; G02F 1/15; G02F 1/155;
(Continued)

(56) References Cited

U.S. PATENT DOCUMENTS 6,722,937 B1    4/2004  Ludwig et al.
8,059,328 B1   11/2011  Kuo et al.
(Continued)

FOREIGN PATENT DOCUMENTS

JP    5 119325    5/1993
JP    2823057   11/1998
(Continued)

OTHER PUBLICATIONS

International Search Report issued Mar. 10, 2015 in PCT/JP2015/050378 filed Jan. 8, 2015 (with translation of category of cited documents).

*Primary Examiner* — Dawayne A Pinkney
(74) *Attorney, Agent, or Firm* — Oblon, McClelland, Maier & Neustadt, L.L.P.

(57) ABSTRACT

The present invention relates to a display element, a photosensitive composition and an electrowetting display. The display element includes: a first electrode layer stack; a second electrode layer stack; a housing space formed between the first and second electrode layer stacks; and a partition wall compartmentalizing the housing space, wherein the housing space contains at least a polar liquid and a non-polar liquid that are immiscible with each other, a surface layer in contact with the partition wall exists on the surface of at least one of the first and second electrode layer stacks that is in contact with the housing space, and an absolute value of the difference in linear expansion coefficient between the partition wall and the surface layer is 150 ppm/K or less.

19 Claims, 1 Drawing Sheet

(51) Int. Cl.
*G02F 1/29* (2006.01)
*G02F 1/133* (2006.01)
*G03F 7/038* (2006.01)
*G03F 7/075* (2006.01)
*G03F 7/032* (2006.01)
*G03F 7/033* (2006.01)
*G03F 7/037* (2006.01)

(52) U.S. Cl.
CPC ............ *G03F 7/038* (2013.01); *G03F 7/0387* (2013.01); *G03F 7/0757* (2013.01)

(58) Field of Classification Search
CPC ........... G02F 1/153; G02B 5/23; G02B 26/00; G02B 26/08; G02B 1/06
USPC ........ 359/290–293, 295, 315–316, 276, 238, 359/245, 242, 259, 244, 253–254, 359/265–275, 665–667, 223–225, 243, 359/260–263; 349/33; 252/586
See application file for complete search history.

(56) References Cited

U.S. PATENT DOCUMENTS

| | | | |
|---|---|---|---|
| 8,896,904 B2 | 11/2014 | Massard et al. | |
| 2005/0211558 A1 | 9/2005 | Sonehara et al. | |
| 2006/0280878 A1 | 12/2006 | Suezaki et al. | |
| 2007/0231747 A1 | 10/2007 | Onimaru et al. | |
| 2010/0110532 A1* | 5/2010 | Takemoto | G02B 3/14 359/316 |
| 2010/0160477 A1* | 6/2010 | Cho | C08J 3/28 522/153 |
| 2010/0233617 A1 | 9/2010 | Wada | |
| 2010/0266956 A1 | 10/2010 | Naoi et al. | |
| 2011/0157679 A1 | 6/2011 | Fike, III et al. | |
| 2012/0296053 A1 | 11/2012 | Hanamura et al. | |
| 2013/0052423 A1 | 2/2013 | Suemitsu et al. | |
| 2013/0222879 A1* | 8/2013 | Kuo | G02B 26/005 359/290 |
| 2013/0278994 A1 | 10/2013 | Feil | |
| 2014/0002888 A1 | 1/2014 | Naito et al. | |
| 2014/0016176 A1 | 1/2014 | Kodani et al. | |
| 2014/0272523 A1 | 9/2014 | Otsuka et al. | |
| 2014/0320948 A1 | 10/2014 | Suzuki et al. | |

FOREIGN PATENT DOCUMENTS

| | | |
|---|---|---|
| JP | 2003 315308 | 11/2003 |
| JP | 2004 513473 | 4/2004 |
| JP | 2005 49723 | 2/2005 |
| JP | 3729554 | 12/2005 |
| JP | 2006 154434 | 6/2006 |
| JP | 3794598 | 7/2006 |
| JP | 2006 201670 | 8/2006 |
| JP | 3992181 | 10/2007 |
| JP | 2007 293306 | 11/2007 |
| JP | 2007 332255 | 12/2007 |
| JP | 4045253 | 2/2008 |
| JP | 2008 242076 | 10/2008 |
| JP | 2010 117614 | 5/2010 |
| JP | 2010 121137 | 6/2010 |
| JP | 2010 184961 | 8/2010 |
| JP | 2010 250109 | 11/2010 |
| JP | 2011 157292 | 8/2011 |
| JP | 2012 63767 | 3/2012 |
| JP | 2012 181513 | 9/2012 |
| JP | 2012 198527 | 10/2012 |
| JP | 2012 256023 | 12/2012 |
| JP | 2013-014801 A | 1/2013 |
| JP | 2013 92701 | 5/2013 |
| JP | 2013 519121 | 5/2013 |
| JP | 2013 522669 | 6/2013 |
| JP | 2013 142753 | 7/2013 |
| JP | 2013 216737 | 10/2013 |
| JP | 2013 228683 | 11/2013 |
| JP | 2013 542465 | 11/2013 |
| JP | 2013 241554 | 12/2013 |
| JP | 2013 242511 | 12/2013 |
| JP | 2014 10249 | 1/2014 |
| JP | 2014 13413 | 1/2014 |
| JP | 2014 48428 | 3/2014 |
| JP | 2014 62195 | 4/2014 |
| JP | 2014 66835 | 4/2014 |
| JP | 2014 80578 | 5/2014 |
| JP | 2014 89970 | 5/2014 |

* cited by examiner

DISPLAY ELEMENT, PHOTOSENSITIVE COMPOSITION AND ELECTROWETTING DISPLAY

TECHNICAL FIELD

The present invention relates to a display element, a photosensitive composition and an electrowetting display.

BACKGROUND ART

An electrowetting phenomenon is a phenomenon which utilizes a change in contact angle of a hydrophobic surface against a polar liquid (and a non-polar liquid) that is induced by, for example, application of a voltage to the polar liquid and non-polar liquid (usually colored) that are immiscible with each other on an electrode having the hydrophobic surface.

Usually, this non-polar liquid is enclosed in a space compartmentalized by a partition wall.

Elements utilizing this electrowetting phenomenon show high brightness and high contrast ratio as well as large viewing angle, high switching rate and the like, and display elements utilizing this phenomenon have relatively low power consumption because they do not require front or backlight. Therefore, such elements are used in a variety of optical application fields, including optical switches for optical fibers, optical shutters or filters for cameras and guide devices, optical pickup elements, optical waveguide materials, video display pixels and the like.

For example, Patent Documents 1 and 2 disclose display elements utilizing such a phenomenon.

PRIOR ART REFERENCES

Patent Documents

[Patent Document 1] JP-T-2013-542465
[Patent Document 2] JP-A-2013-92701

SUMMARY OF THE INVENTION

Problems to be Solved by the Invention

The above-described display elements display letters, figures and the like in response to a change in the state of a non-polar liquid based on the presence or absence of an applied voltage; therefore, leakage of the non-polar liquid, which is enclosed in a space compartmentalized by a partition wall, into other space tends to make the display elements unable to perform proper display.

Accordingly, it is required that the space compartmentalized by the partition wall be such a space that does not allow the non-polar liquid to leak out into other space.

Further, since the above-described display elements display letters, figures and the like in response to a change in the state of a non-polar liquid based on the presence or absence of an applied voltage, it is desired that the change in the state of the liquid based on the presence or absence of an applied voltage be performed smoothly. Along with the demand for an increase in the service life of display elements, it is also demanded that the change in the state of the liquid be performed stably over a prolonged period of time.

Conventional display elements, however, still have room for improvement to satisfy these demands.

The present invention was made in view of the above-described demands, and an object of the present invention is to provide a display element capable of smoothly and stably changing the state of a non-polar liquid contained therein over a prolonged period of time based on the presence or absence of an applied voltage, in which display element cracking or detachment between a partition wall and a layer in contact therewith is not likely to occur.

Technical Solution

Under such circumstances, in order to solve the above-described problems, the present inventors intensively studied and discovered that the above-described problems can be solved by a display element comprising: a first electrode layer stack; a second electrode layer stack; a housing space which contains a polar liquid and a non-polar liquid that are immiscible with each other and is formed between the first and second electrode layer stacks; and a partition wall compartmentalizing the housing space, an absolute value of the difference in thermal linear expansion coefficient between the partition wall and a surface layer in contact with the partition wall being in a prescribed range, the surface layer existing on the surface of at least one of the first and second electrode layer stacks that is in contact with the housing space, thereby completing the present invention.

Examples of the constitution of the present invention are described below.

[1] A display element, comprising: a first electrode layer stack; a second electrode layer stack; a housing space formed between the first and second electrode layer stacks; and a partition wall compartmentalizing the housing space, wherein the housing space comprises at least a polar liquid and a non-polar liquid that are immiscible with each other, a surface layer in contact with the partition wall exists on the surface of at least one of the first and second electrode layer stacks that is in contact with the housing space, and an absolute value of the difference in thermal linear expansion coefficient between the partition wall and the surface layer is 150 ppm/K or less.

[2] The display element according to [1], wherein the partition wall has a thermal linear expansion coefficient of 0.1 to 150 ppm/K.

[3] The display element according to [1] or [2], wherein the partition wall is a film obtained from a photosensitive composition.

[4] The display element according to any one of [1] to [3], wherein the partition wall is a film obtained from a negative photosensitive composition.

[5] The display element according to [4], wherein the negative photosensitive composition comprises an alkali-soluble polymer, a cross-linking agent and a photoinitiator.

[6] The display element according to [5], wherein the cross-linking agent is at least one compound selected from the group consisting of ethylenically unsaturated group-containing compounds, epoxy group or oxetanyl group-containing compounds and alkoxyalkyl group-containing compounds.

[7] The display element according to [5] or [6], wherein the alkali-soluble polymer is a compound having at least one functional group selected from the group consisting of a carboxyl group, a phenolic hydroxyl group and a silanol group.

[8] The display element according to any one of [5] to [7], wherein the alkali-soluble polymer is at least one polymer selected from the group consisting of acrylic resins, polyimides, polybenzoxazoles, polysiloxanes, polyolefins, cardo skeleton-containing resins and novolac resins.

[9] The display element according to any one of [5] to [8], wherein the alkali-soluble polymer has a weight-average molecular weight of 1,000 to 100,000.

[10] A photosensitive composition for forming a partition wall, said partition wall compartmentalizing a first electrode layer stack, a second electrode layer stack and a housing space which is formed between the first and second electrode layer stacks and comprises a polar liquid and a non-polar liquid that are immiscible with each other, wherein an absolute value of the difference in thermal linear expansion coefficient between the partition wall and a surface layer is 150 ppm/K or less, the surface layer existing on the surface of at least one of the first and second electrode layer stacks that is in contact with the housing space and being in contact with the partition wall.

[11] The photosensitive composition according to [10], which is a negative composition comprising an alkali-soluble polymer, a cross-linking agent and a photoinitiator.

[12] An electrowetting display, comprising the display element according to any one of [1] to [9].

[13] The electrowetting display according to [12], comprising a color filter layer.

Advantageous Effects of Invention

According to the present invention, a display element capable of smoothly and stably changing the state of a non-polar liquid contained therein over a prolonged period of time based on the presence or absence of an applied voltage, in which display element cracking or detachment between a partition wall and a layer in contact therewith is not likely to occur, can be provided.

MODE FOR CARRYING OUT THE INVENTION

<<Display Element>>

Figure 1:
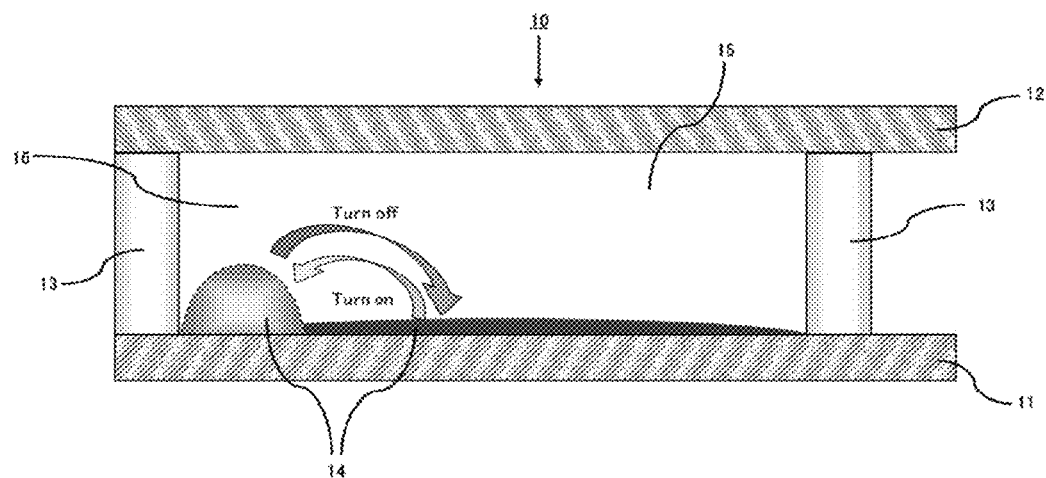
FIG. 1 is a schematic cross-sectional view showing one example of the display element of the present invention.

The display element according to the present invention is represented by, for example, FIG. 1, and comprises: a first electrode layer stack 11; a second electrode layer stack 12; a housing space 16 which is formed between the first electrode layer stack 11 and the second electrode layer stack 12; and a partition wall 13 which compartmentalizes the housing space 16, wherein the housing space 16 comprises at least a polar liquid 15 and a non-polar liquid 14 that are immiscible with each other, a surface layer (not shown) in contact with the partition wall exists on the surface of at least one of the first electrode layer stack 11 and the second electrode layer stack 12 that is in contact with the housing space, and an absolute value of the difference in thermal linear expansion coefficient between the partition wall 13 and the surface layer is 150 ppm/K or less.

The absolute value of the difference in thermal linear expansion coefficient between the partition wall and the surface layer is 150 ppm/K or less, preferably 130 ppm/K or less, more preferably 110 ppm/K or less, particularly preferably 100 ppm/K or less. Specifically, the absolute value of the difference in thermal linear expansion coefficient can be measured by the method described in the section of Examples below.

When the absolute value of the difference in thermal linear expansion coefficient is in the above-described range, cracking and detachment between the partition wall and the surface layer in contact therewith is not likely to occur. Particularly, even if the display element is used under a high-temperature or low-temperature condition, such cracking and detachment is not likely to occur. Thus, according to the present invention, a display element comprising such a housing space that does not allow a non-polar liquid to leak out into other space, which display element has excellent durability and display properties, can be obtained. Further, if the absolute value of the difference in thermal linear expansion coefficient is in the above-described range, a display element capable of smoothly and stably changing the state of a non-polar liquid contained therein over a prolonged period of time based on the presence or absence of an applied voltage can be obtained.

In the present invention, there are cases where the partition wall and the electrode layer stack(s) are adhered using an adhesive or the like. In such cases, the above-described surface layer is not an adhesive layer and refers to a layer existing on the surface of the electrode layer stack(s) that is in contact with the housing space.

In FIG. 1, there is the surface layer on the first electrode layer stack 11 that is in contact with the housing space 16. The surface layer is a hydrophobic layer. Thus, in a display element 10, when no voltage is applied ("turn off" in FIG. 1), the non-polar liquid (colored liquid) 14 exists evenly such that it covers the surface of the first electrode layer stack 11. Meanwhile, when voltage is applied to this display element 10 ("turn on" in FIG. 1), the non-polar liquid 14 exists in a substantially hemispherical shape near the partition wall 13.

In this manner, in the display element of the present invention, the state of the non-polar liquid changes based on the presence or absence of an applied voltage and, by using a colored non-polar liquid, the display element of the present invention is allowed to display, for example, a colored state and a transparent state.

The voltage applied to the display element of the present invention is not particularly restricted as long as it is such a voltage that can change the state of the non-polar liquid.

The display element of the present invention may be an element comprising a single pixel region (cell) formed by compartmentalizing the housing space with four partition walls or the like; however, it is usually an element comprising plural pixel regions that are formed by compartmentalizing the housing space with plural partition walls, and each pixel region is formed such that it is capable of performing full-color display on the display surface side of the display element. Further, by allowing the state of the non-polar liquid in each pixel region to be changed by an electrowetting phenomenon, the colors displayed on the display surface side can be modified.

<Partition Wall>

The partition wall compartmentalizes the housing space formed between the first and second electrode layer stacks. The partition wall is not particularly restricted as long as it functions as a wall that prevents movement of the non-polar liquid between adjacent pixel regions (cells) that usually exist in series.

Accordingly, the partition wall may be in contact with both the first electrode layer stack 11 and the second electrode layer stack 12 as shown in FIG. 1; however, when the non-polar liquid 14 exists on the side of the first electrode layer stack 11 in the housing space 16 as shown in FIG. 1, the partition wall may exist only on the side of the first stack 11 and does not have to be in contact with the second electrode layer stack 12.

When the partition wall is in contact with the first and/or second electrode layer stacks, the partition wall may be integrated with the first and/or second electrode layer stacks, or the partition wall may be adhered to the first and/or second electrode layer stacks.

The partition wall has a thermal linear expansion coefficient of preferably 0.1 to 150 ppm/K, more preferably 0.1 to 140 ppm/K, still more preferably 0.1 to 120 ppm/K, particularly preferably 0.1 to 100 ppm/K. Specifically, the thermal linear expansion coefficient can be measured by the method described in the section of Examples below.

When the thermal linear expansion coefficient of the partition wall is in the above-described range, not only a display element in which cracking or detachment between a partition wall and a layer in contact therewith is not likely to occur can be obtained, but also the state of a non-polar liquid contained therein can be changed smoothly and stably over a prolonged period of time based on the presence or absence of voltage applied to the display element.

A partition wall having such a thermal linear expansion coefficient can be obtained by appropriately adjusting the composition used for forming the partition wall, specifically, by appropriately adjusting the amount of a cross-linkable monomer(s) to be used and/or the types and ratios of a polymer and cross-linking agent used in the composition or by appropriately adjusting the amount of an inorganic filler to be used. For example, a partition wall having a low thermal linear expansion coefficient can be obtained by increasing the amount of a cross-linkable monomer to be used, the amount of a cross-linking agent to be used with respect to the amount of a polymer, or the amount of an inorganic filler to be used.

The height of the partition wall (length in the direction of the gap between the first and second electrode layer stacks; length in the vertical direction in FIG. 1) is not particularly restricted as long as the partition wall can function to inhibit movement of the non-polar liquid between pixel regions.

Further, the thickness of the partition wall (length in the direction substantially perpendicular to the direction of the gap between the first and second electrode layer stacks; length in the horizontal direction in FIG. 1) is also not particularly restricted as long as the partition wall can function to inhibit the movement of the non-polar liquid; however, from the standpoints of the strength and the like of the partition wall, the thickness of the partition wall is 1 to 50 μm, preferably 5 to 40 μm.

The partition wall may be a single-layer film, or a laminate comprising a BM (black matrix) layer, a reinforcement layer, a surface coating layer or the like. Further, the partition wall may be a film having no hole, or a film having lattice-form or slit-form holes.

[Photosensitive Composition]

It is preferred that the partition wall be a film obtained from a photosensitive composition because, for example, this enables to easily produce a display element comprising plural pixel regions that are formed by compartmentalizing a housing space with plural partition walls.

It is more preferred that the partition wall be a film obtained from a composition whose components are adjusted such that the thermal linear expansion coefficient of the resulting partition wall is in the above-described range. By using such a composition, not only a display element capable of smoothly and stably changing the state of a non-polar liquid contained therein over a prolonged period of time based on the presence or absence of an applied voltage, in which the cracking or detachment is not likely to occur, can be obtained, but also a partition wall of a desired shape can be easily formed.

The above-described photosensitive composition may be a positive photosensitive composition or a negative photosensitive composition; however, it is preferably a negative photosensitive composition because, for example, this enables to easily produce a display element comprising plural pixel regions that are formed by compartmentalizing a housing space with plural partition walls and a display element in which reduction in display properties is not likely to occur over an extended period can thus be obtained.

The photosensitive composition is not particularly restricted; however, it is preferably a composition comprising an alkali-soluble polymer, a cross-linking agent and a photoinitiator because, for example, such a composition can yield a partition wall showing only small changes in properties over a prolonged period of time. Examples of such a composition include those described in JP-A-2006-154434 and JP-A-2007-293306.

The photosensitive composition can easily form a partition wall which compartmentalizes the first electrode layer stack, the second electrode layer stack and a housing space that is formed between the first and second electrode layer stacks and comprises a polar liquid and a non-polar liquid that are immiscible with each other, wherein an absolute value of the difference in thermal linear expansion coefficient between the partition wall and a surface layer is 150 ppm/K or less, preferably 130 ppm/K or less, more preferably 110 ppm/K or less, particularly preferably 100 ppm/K or less, the surface layer existing on the surface of at least one of the first and second electrode layer stacks that is in contact with the housing space and being in contact with the partition wall. Therefore, the photosensitive composition can be suitably used as a composition for forming such a partition wall. It is preferred that this photosensitive composition be a negative composition comprising an alkali-soluble polymer, a cross-linking agent and a photoinitiator.

<Alkali-Soluble Polymer>

The alkali-soluble polymer is not particularly restricted. In the present invention, the term "alkali-soluble" means that the polymer can be dissolved in an alkaline solution, such as 2.38%-by-mass aqueous tetramethylammonium hydroxide solution.

The alkali-soluble polymer may be used individually, or two or more thereof, for example, a blend of an alkali-soluble polymer and an alkali-insoluble polymer or a blend of two or more alkali-soluble polymers or the like, may be used.

From the standpoints of, for example, the solubility in alkaline solutions, particularly 2.38%-by-mass aqueous tetramethylammonium hydroxide solution, the alkali-soluble polymer is preferably a compound having at least one functional group selected from the group consisting of a carboxyl group, a phenolic hydroxyl group and a silanol group.

As such an alkali-soluble polymer, an acrylic resin, polyimide, polybenzoxazole, polysiloxane, polyolefin, cardo skeleton-containing resin or novolac resin is preferred.

From the standpoints of the developability and the like of the resulting photosensitive composition, the weight-average molecular weight of the alkali-soluble polymer, which is measured by gel permeation column chromatography, specifically the method described in the section of Examples below, is preferably 1,000 to 100,000, more preferably 1,500 to 50,000.

From the standpoints of the developability and the like of the resulting photosensitive composition, the content of the alkali-soluble polymer is preferably 5 to 60% by mass, more preferably 10 to 50% by mass, with respect to 100% by mass of the photosensitive composition.

Acrylic Resin

The acrylic resin is not particularly restricted; however, from the standpoint of the alkali solubility, it is preferably one which has at least one functional group selected from the group consisting of a carboxyl group, a phenolic hydroxyl group and a silanol group and, from the standpoints of the developability and the like of the resulting photosensitive composition, it is preferably a copolymer obtained using the below-described compounds (a) and (b) as monomers (it is noted here that the monomers include acrylic compounds):

compound (a): a compound having at least one functional group selected from the group consisting of a carboxyl group, a phenolic hydroxyl group and a silanol group; and compound (b): a compound other than the compound (a).

In the compound (a), a compound having a carboxyl group is not particularly restricted, and examples thereof include monocarboxylic acids such as acrylic acid, methacrylic acid and crotonic acid; dicarboxylic acids such as maleic acid, fumaric acid, citraconic acid, mesaconic acid and itaconic acid; and methacrylic acid derivatives having a carboxyl group and an ester bond, such as 2-maleinoloyloxyethyl methacrylate, 2-succinoloyloxyethyl methacrylate and 2-hexahydrophthaloyloxyethyl methacrylate. These compounds may be used individually, or two or more thereof may be used. Thereamong, acrylic acid, methacrylic acid and 2-hexahydrophthaloyloxyethyl methacrylate are preferred.

In the compound (a), a compound having a phenolic hydroxyl group is not particularly restricted, and examples thereof include vinyl monomers having a phenolic hydroxyl group, such as 3-hydroxystyrene, 4-hydroxystyrene, vinyl-4-hydroxybenzoate, 3-isopropenylphenol and 4-isopropenylphenol. These compounds may be used individually, or two or more thereof may be used. Thereamong, 4-isopropenylphenol is preferred.

In the compound (a), a compound having a silanol group is not particularly restricted, and examples thereof include hydrolysates of alkoxysilyl group-containing vinyl monomers, such as vinyltrimethoxysilane, vinyltriethoxysilane, vinyltripropoxysilane, vinylmethyldimethoxysilane, vinylmethyldiethoxysilane, vinylmethyldipropoxysilane, γ-(meth)acryloxypropyltrimethoxysilane, γ-(meth)acryloxypropyltriethoxysilane, γ-(meth)acryloxypropyltripropoxysilane, γ-(meth)acryloxypropylmethyldimethoxysilane, γ-(meth)acryloxypropylmethyldiethoxysilane and γ-(meth) acryloxypropylmethyldipropoxysilane. These compounds may be used individually, or two or more thereof may be used.

Examples of the compound (b) include alkyl (meth) acrylates such as methyl methacrylate, ethyl methacrylate, n-butyl (meth)acrylate, sec-butyl (meth)acrylate, t-butyl (meth)acrylate and isopropyl (meth)acrylate; alkoxy (meth) acrylates such as 2-ethoxyethyl (meth)acrylate and 2-methoxyethyl (meth)acrylate; hydroxyl group-containing (meth)acrylates such as 2-hydroxyethyl (meth)acrylate; halogen atom-containing (meth)acrylates such as 2,2,2-trifluoroethyl (meth)acrylate; aryl (meth)acrylates such as phenyl (meth)acrylate and benzyl (meth)acrylate; heterocyclic group-containing (meth)acrylates such as glycidyl (meth) acrylate; dicarboxylic acid diesters such as diethyl maleate, diethyl fumarate and diethyl itaconate; vinyl group-containing aromatic compounds such as styrene, α-methylstyrene, m-methylstyrene, p-methylstyrene and p-methoxystyrene; conjugated diolefins such as 1,3-butadiene, isoprene and 1,4-dimethylbutadiene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; imide group-containing polymerizable compounds such as N-phenylmaleimide; vinyl fatty acids such as vinyl acetate; and compounds represented by the following Formulae (6) to (8).

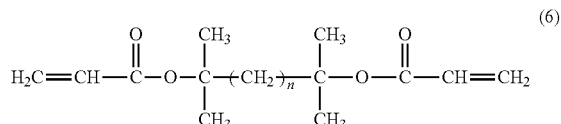

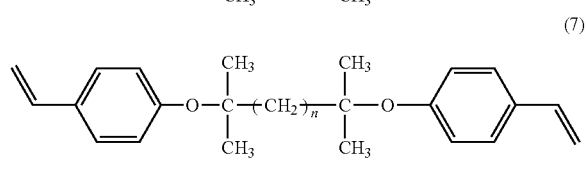

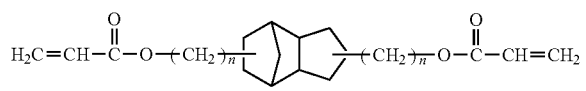

[wherein, "n" independently represents a natural number of 1 to 6]

Thereamong, (meth)acrylates such as methyl methacrylate, ethyl methacrylate, n-butyl (meth)acrylate, 2-methoxyethyl acrylate and benzyl methacrylate; styrene, N-phenylmaleimide, 2-hydroxyethyl methacrylate, 2,2,2-trifluoroethyl acrylate, glycidyl methacrylate and compounds represented by the Formulae (6) and (7) are preferred.

The compound (b) may be used individually, or two or more thereof may be used.

The compound (b) is used in an amount of preferably 5 to 95% by mass, more preferably 10 to 90% by mass, with respect to a total of 100% by mass of the compounds (a) and (b).

The above-described acrylic resin can be obtained by, for example, polymerizing the compounds (a) and (b) in a conventionally known organic solvent using a conventionally known radical initiator.

Polyimide

The polyimide is not particularly restricted; however, from the standpoint of the alkali solubility, it is preferably one which has at least one functional group selected from the group consisting of a carboxyl group, a phenolic hydroxyl group and a silanol group, particularly a polymer having the above-described functional group(s) and a structural unit represented by the following Formula (A1).

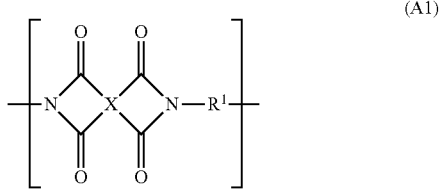

In the Formula (A1), $R^1$ represents a hydroxyl group-containing divalent group and X represents a tetravalent organic group. Examples of the $R^1$ include divalent groups represented by the following Formula (a1).

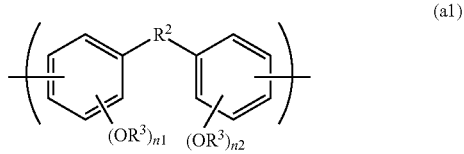

In the Formula (a1), $R^2$ represents a single bond, an oxygen atom, a sulfur atom, a sulfonyl group, a carbonyl group, a methylene group, a dimethylmethylene group or a bis(trifluoromethyl)methylene group; and $R^3$s independently represent a hydrogen atom, a formyl group, an acyl group or an alkyl group. However, at least one of the $R^3$s is a hydrogen atom. Further, "n1" and "n2" each independently represent an integer of 0 to 2; however, at least one of "n1" and "n2" is 1 or 2. When the sum of "n1" and "n2" is 2 or larger, the plural $R^3$s may be the same or different.

Examples of the tetravalent organic group represented by the X include tetravalent aliphatic hydrocarbon groups, tetravalent aromatic hydrocarbon groups, and groups represented by the following Formula (1). The X is preferably a tetravalent organic group derived from a tetracarboxylic acid dianhydride, more preferably a group represented by the following Formula (1).

In the Formula (1), Ars independently represent a trivalent aromatic hydrocarbon group; and A represents a direct bond or a divalent group. Examples of the divalent group include an oxygen atom, a sulfur atom, a sulfonyl group, a carbonyl group, a methylene group, a dimethylmethylene group and a bis(trifluoromethyl)methylene group.

The above-described polyimide can be obtained by a conventionally known method, for example, imidization by a conventionally known method using a diamine, an acid anhydride and the like.

In the polymer having a structural unit represented by the Formula (A1), the X or $R^1$ in the Formula (A1) may be at least one functional group selected from the group consisting of a carboxyl group, a phenolic hydroxyl group and a silanol group, and the polymer may be one which has the functional group(s) and is obtained by partial imidization using a compound having the functional group(s) as a raw material for synthesizing the polymer.

The imidization ratio of the polyimide is preferably not less than 1%, more preferably not less than 3%, still more preferably not less than 5%. The upper limit value of the imidization ratio may be 100%; however, it is preferably 50%, more preferably 30%. It is preferred that the imidization ratio be in this range because, for example, a polymer having excellent heat resistance and alkali solubility can be obtained.

The imidization ratio can be determined, for example, as follows.

First, the infrared absorption spectrum of the subject polyimide is measured and the presence of absorption peaks attributed to the imide structure of the polyimide (near 1,780 $cm^{-1}$ and near 1,377 $cm^{-1}$) is confirmed. Then, after heat-treating the polyimide for 1 hour at 350° C., the infrared absorption spectrum is measured again. The peak intensity near 1,377 $cm^{-1}$ is compared between before and after the heat treatment. Taking the post-heat treatment imidization ratio of the polyimide as 100%, the pre-heat treatment imidization ratio of the polyimide is determined by an equation: Pre-heat treatment imidization ratio={Pre-heat treatment peak intensity near 1,377 $cm^{-1}$/Post-heat treatment peak intensity near 1,377 $cm^{-1}$}×100(%). For the infrared absorption spectrum measurements, for example, "NICOLET 6700FT-IR" (manufactured by Thermo Electron Co., Ltd.) is employed.

Polybenzoxazole

The polybenzoxazole is not particularly restricted; however, from the standpoint of the alkali solubility, it is preferably one which has at least one functional group selected from the group consisting of a carboxyl group, a phenolic hydroxyl group and a silanol group, particularly a polymer having the above-described functional group(s) and a structural unit represented by the following Formula (a5-1).

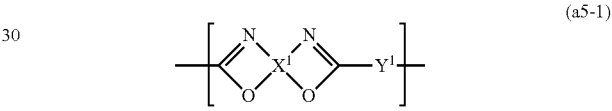

In the Formula (a5-1), $X^1$ represents an aromatic ring-containing tetravalent organic group, and $Y^1$ represents a divalent organic group.

In the Formula (a5-1), the aromatic ring of the $X^1$ may be either a substituted or unsubstituted ring. Examples of a substituent include —OH, —COOH, alkyl groups, alkoxy groups and alicyclic hydrocarbon groups. N and O binding to the $X^1$ are, for example, bound to adjacent carbon atoms on the aromatic ring of the $X^1$, forming a benzoxazole ring. When the $X^1$ contains two or more aromatic rings, the plural aromatic rings may form any of linked polycyclic and condensed polycyclic structures.

The total number of carbon atoms of the $X^1$ is preferably 6 to 24, more preferably 6 to 20, still more preferably 6 to 18.

In the Formula (a5-1), $Y^1$ is preferably a divalent group containing at least one ring selected from alicyclic rings and aromatic rings, more preferably a group having one to four aromatic rings, particularly preferably a group having two aromatic rings.

The alicyclic ring(s) and/or aromatic ring(s) contained in the $Y^1$ may each be a substituted or unsubstituted ring. Examples of a substituent include —OH, —COOH, alkyl groups, alkoxy groups, alkoxycarbonyl groups and alicyclic hydrocarbon groups. When the $Y^1$ contains two or more of the above-described rings, the plural rings may form any of linked polycyclic and condensed polycyclic structures.

The total number of carbon atoms of the $Y^1$ is preferably 4 to 24, more preferably 4 to 15, still more preferably 6 to 12.

The above-described polybenzoxazole can be obtained by a conventionally known method, for example, polymerization of at least one selected from dicarboxylic acids and their diesters and dihalides with a diamine having two hydroxyl groups.

In the polymer having a structural unit represented by the Formula (a5-1), the $X^1$ or $Y^1$ in the Formula (a5-1) may be at least one functional group selected from the group consisting of a carboxyl group, a phenolic hydroxyl group and a silanol group, and the polymer may be one which has the functional group(s) and is obtained by partial cyclization using a compound having the functional group(s) as a raw material for synthesizing the polymer.

The cyclization ratio of the polybenzoxazole is preferably not less than 1%, more preferably not less than 3%, still more preferably not less than 5%. The upper limit value of the cyclization ratio may be 100%; however, it is preferably 50%, more preferably 30%. It is preferred that the cyclization ratio be in this range because, for example, a polymer having excellent heat resistance and alkali solubility can be obtained.

The cyclization ratio can be determined, for example, as follows.

First, the infrared absorption spectrum of the subject polybenzoxazole is measured and the presence of absorption peaks attributed to the benzoxazole ring (near 1,557 cm$^{-1}$, 1,574 cm$^{-1}$) is confirmed. Then, after heat-treating the polybenzoxazole for 1 hour at 350° C., the infrared absorption spectrum is measured again. The peak intensity near 1,554 cm$^{-1}$ is compared between before and after the heat treatment. Taking the post-heat treatment cyclization ratio of the polybenzoxazole as 100%, the pre-heat treatment cyclization ratio of the polybenzoxazole is determined by an equation: Pre-heat treatment cyclization ratio={Pre-heat treatment peak intensity near 1,554 cm$^{-1}$/Post-heat treatment peak intensity near 1,554 cm$^{-1}$}×100(%). For the infrared absorption spectrum measurements, for example, "NICOLET 6700FT-IR" (manufactured by Thermo Electron Co., Ltd.) is employed.

Polysiloxane

The polysiloxane is not particularly restricted; however, from the standpoint of the alkali solubility, it is preferably one which has at least one functional group selected from the group consisting of a carboxyl group, a phenolic hydroxyl group and a silanol group, particularly a polysiloxane which has the above-described functional group(s) and is obtained by hydrolysis and partial condensation of an organosilane represented by the following Formula (a4).

(a4)

In the Formula (a4), $R^1$ represents a hydrogen atom, an alkyl group having 1 to 10 carbon atoms, an alkenyl group having 2 to 10 carbon atoms, an aryl group-containing group having 6 to 15 carbon atoms, an epoxy ring-containing group having 2 to 15 carbon atoms or a group obtained by replacing one or more hydrogen atoms contained in the above-described alkyl group with a substituent (substituted alkyl group) and, when there are plural $R^1$s, the $R^1$s may be the same or different from each other; $R^2$ represents a hydrogen atom, an alkyl group having 1 to 6 carbon atoms, an acyl group having 1 to 6 carbon atoms or an aryl group having 6 to 15 carbon atoms and, when there are plural $R^2$s, the $R^2$s may be the same or different from each other; and "n" represents an integer of 0 to 3.

The above-described substituent is, for example, at least one selected from halogen atoms, an amino group, a hydroxyl group, a mercapto group, an isocyanate group and a (meth)acryloyloxy group.

From the standpoint of allowing the partition wall to satisfy both crack resistance and hardness, the phenyl group content in the polysiloxane is preferably 20 to 70 mol, more preferably 30 to 55 mol, with respect to 100 mol of Si atoms. The phenyl group content can be measured specifically by the method described in the section of Examples below.

Polyolefin

The polyolefin is not particularly restricted; however, from the standpoint of the alkali solubility, it is preferably one which has at least one functional group selected from the group consisting of a carboxyl group, a phenolic hydroxyl group and a silanol group, particularly a cyclic olefin polymer having a protic polar group. The term "protic polar group" refers to an atomic group in which a hydrogen atom is directly bound to an atom belonging to the Group 15 or 16 of the periodic table. The atom belonging to the Group 15 or 16 of the periodic table is preferably an oxygen atom, a nitrogen atom or a sulfur atom, particularly preferably an oxygen atom.

The cyclic olefin polymer refers to a homopolymer or copolymer of a cyclic olefin having a cyclic structure, such as an alicyclic ring or an aromatic ring, and a carbon-carbon double bond. The cyclic olefin polymer may also have a structural unit derived from a monomer other than the cyclic olefin.

From the standpoint of the alkali solubility, the cyclic olefin polymer having a protic polar group is preferably a polymer which has at least one functional group selected from the group consisting of a carboxyl group, a phenolic hydroxyl group and a silanol group and has a structural unit represented by, for example, the following Formula (A6-1), particularly the Formula (A6-1) and the Formula (A6-2).

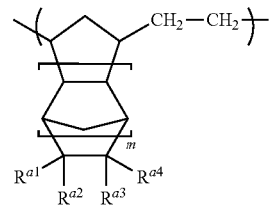

(A6-1)

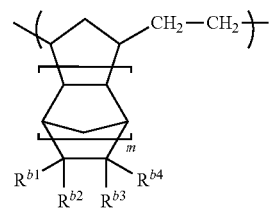

(A6-2)

In the Formula (A6-1), $R^{a1}$ to $R^{a4}$ each independently represent a hydrogen atom or $-X_n-R^{a5}$ (wherein, X is a divalent organic group; n is 0 or 1; $R^{a5}$ is an alkyl group, an aromatic group or the above-described protic polar group, which alkyl group or aromatic group may have a substituent). At least one of the $R^{a1}$ to $R^{a4}$ is a $-X_n-R^{a5}$ group wherein $R^{a5}$ is the protic polar group. Further, "m" is an integer of 0 to 2, preferably 0 or 1.

Examples of the divalent organic group represented by the X include alkylene groups having 1 to 18 carbon atoms, such as a methylene group and an ethylene group; and arylene groups having 6 to 24 carbon atoms, such as a phenylene group.

In the $R^{a5}$, the alkyl group is, for example, a linear or branched alkyl group having 1 to 18 carbon atoms, and the aromatic group is, for example, an aromatic group having 6 to 24 carbon atoms.

In the Formula (A6-2), $R^{b1}$ is a polar group other than the protic polar group, preferably an acyloxy group having 2 to 12 carbon atoms such as an acetoxy group, an alkoxycarbonyl group having 2 to 12 carbon atoms such as a methoxycarbonyl group, an ethoxycarbonyl group, an n-propoxycarbonyl group, an isopropoxycarbonyl group, an n-butoxycarbonyl group or a 2,2,2-trifluoroethoxycarbonyl group, an aryloxycarbonyl group having 7 to 24 carbon atoms such as a phenoxycarbonyl group, a cyano group, or a halogen atom such as a chlorine atom.

$R^{b2}$ is a hydrogen atom or an alkyl group having 1 to 18 carbon atoms such as a methyl group.

$R^{b3}$ and $R^{b4}$ are hydrogen atoms.

It is noted here that the $R^{b1}$ to $R^{b4}$ in an arbitrary combination, together with two carbon atoms to which they are bound, may also form a 3 to 5-membered heterocyclic structure containing an oxygen atom or a nitrogen atom as a ring-constituting atom.

Further, "m" is an integer of 0 to 2, preferably 0 or 1.

The above-described polyolefin can be obtained by a conventionally known method, for example, polymerization of a monomer which derives a structural unit represented by the Formula (A6-1). Further, the polymer obtained by the polymerization may be hydrogenated as well.

Cardo Skeleton-Containing Resin

The cardo skeleton-containing resin is not particularly restricted. The "cardo skeleton" refers to a skeletal structure in which two cyclic structures are bound to a ring carbon atom constituting a cyclic structure, and examples thereof include a structure in which two aromatic rings (e.g., benzene rings) are bound to the carbon atom at the 9-position of a fluorene ring.

As the cardo skeleton-containing resin, from the standpoint of the alkali solubility, it is preferred to use a resin having at least one group selected from a carboxyl group, a phenolic hydroxyl group and a silanol group.

Specific examples of the skeletal structure in which two cyclic structures are bound to a ring carbon atom constituting a cyclic structure include a 9,9-bis(phenyl)fluorene skeleton, a 9,9-bis(hydroxyphenyl)fluorene skeleton, a 9,9-bis(cyanophenyl or aminoalkylphenyl)fluorene skeleton, an epoxy group-containing 9,9-bis(phenyl)fluorene skeleton, and a (meth)acryl group-containing 9,9-bis(phenyl)fluorene skeleton.

The cardo skeleton-containing resin can be obtained by a conventionally known method, for example, polymerization of a monomer having a cardo skeleton.

As the cardo skeleton-containing resin, a commercially available product can be used as well. Examples thereof include polyester compounds having a cardo skeleton, such as OGSOL CR-TR1, OGSOL CR-TR2, OGSOL CR-TR3, OGSOL CR-TR4, OGSOL CR-TR5 and OGSOL CR-TR6, all of which are manufactured by Osaka Gas Chemicals Co., Ltd.

Novolac Resin

The novolac resin is not particularly restricted. Examples of the novolac resin include resins having, for example, a phenol novolac structure or a resol novolac structure, which are obtained by reaction between a phenol compound and an aldehyde compound.

As the novolac resin, one which is soluble to 2.38%-by-weight tetramethylammonium hydroxide is preferred.

The novolac resin is, for example, one having a structural unit represented by the following Formula (C1).

In the Formula (C1), A represents a phenolic hydroxyl group-containing divalent aromatic group, and $R^1$ represents a methylene group, an alkylene group having 2 to 30 carbon atoms, a divalent alicyclic hydrocarbon group having 4 to 30 carbon atoms, an aralkylene group having 7 to 30 carbon atoms or a group represented by $-R^2-Ar-R^2-$ (wherein, Ar represents a divalent aromatic group; and $R^2$s each independently represent a methylene group or an alkylene group having 2 to 20 carbon atoms). Further, one of the hydrogen atoms of the methylene group may be substituted with a cyclopentadienyl group, an aromatic ring, an aromatic ring-containing group, or a heterocycle having a nitrogen atom, a sulfur atom, an oxygen atom or the like.

Regarding the $R^1$, examples of the group represented by $-R^2-Ar-R^2-$ include a group represented by $-CH_2-Ph-CH_2-$ (wherein, Ph is a phenylene group).

Regarding the A, the phenolic hydroxyl group-containing divalent aromatic group is, for example, a phenolic hydroxyl group-containing benzene ring or a phenolic hydroxyl group-containing condensed polycyclic aromatic group. The phenolic hydroxyl group-containing condensed polycyclic aromatic group is, for example, a condensed polycyclic aromatic hydrocarbon group in which some or all of the hydrogen atoms that are contained therein and bound to aromatic ring carbons are substituted with hydroxyl groups. Examples of the condensed polycyclic aromatic hydrocarbon group include a naphthalene ring, an anthracene ring and a phenanthrene ring.

The novolac resin can be obtained by a conventionally known method using, for example, phenol, formaldehyde and an acid catalyst or a base catalyst. The novolac resin can also be obtained by the production method described in, for example, Japanese Patent No. 2823057, Japanese Patent No. 3729554, Japanese Patent No. 3794598 or Japanese Patent No. 3992181.

As the novolac resin, a commercially available product can be used as well. Examples thereof include KAYARAD CCR-1291H and CCR-1235, which are manufactured by Nippon Kayaku Co., Ltd.; and PR-40, PR-45, PR-80 and PR-85, which are manufactured by DIC Corporation.

<Cross-Linking Agent>

The above-described cross-linking agent is not particularly restricted as long as it is a compound that has a cross-linkable functional group and is capable of reacting with the above-described alkali-soluble polymer to form a cross-linked structure.

Examples of the cross-linkable functional group include an oxetanyl group; epoxy group-containing groups such as a glycidyl ether group, a glycidyl ester group and a glycidyl amino group; alkoxyalkyl groups such as a methoxymethyl group and an ethoxymethyl group; a benzyloxymethyl group; an acetoxymethyl group; a benzoyloxymethyl group; a formyl group; an acetyl group; a dimethylaminomethyl group; a diethylaminomethyl group; a dimethylolaminomethyl group; a diethylolaminomethyl group; a morpholinomethyl group; and ethylenically unsaturated groups such as a vinyl group, a vinylidene group and a (meth)acryloyl group.

Thereamong, the cross-linkable functional group is preferably an ethylenically unsaturated group, an epoxy group, an oxetanyl group or an alkoxyalkyl group because, for example, a partition wall having excellent surface hardness and showing only small changes in properties over an extended period of time can be thereby obtained.

Examples of the above-described ethylenically unsaturated group-containing compounds include compounds having at least two ethylenically unsaturated groups in the molecule, and preferred examples thereof include compounds having two or more (meth)acryloyl groups.

Specific examples of such compounds include trimethylolpropane tri(meth)acrylate, ethylene glycol di(meth)acrylate, diethylene glycol di(meth)acrylate, tetraethylene glycol di(meth)acrylate, polyethylene glycol di(meth)acrylate, 1,4-butanediol di(meth)acrylate, butylene glycol di(meth)acrylate, propylene glycol di(meth)acrylate, trimethylolpropane di(meth)acrylate, 1,6-hexanediol di(meth)acrylate, 1,9-nonanediol di(meth)acrylate, neopentyl glycol di(meth)acrylate, tris(2-hydroxyethyl)isocyanurate tri(meth)acrylate, tris(2-hydroxyethyl)isocyanurate di(meth)acrylate, tricyclodecane dimethanol di(meth)acrylate, cyclohexane dimethanol di(meth)acrylate, bisphenol A alkylene oxide di(meth)acrylate, (meth)acrylate obtained by adding (meth)acrylic acid to diglycidyl ether of bisphenol A, bisphenol A di(meth)acryloyloxyethyl ether, bisphenol A di(meth)acryloyloxyethyloxyethyl ether, bisphenol A di(meth)acryloyloxymethylethylether, bisphenol F alkyleneoxide di(meth)acrylate, ditrimethylolpropane tetra(meth)acrylate, tetramethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, ethylene oxide-added trimethylolpropane tri(meth)acrylate, ethylene oxide-added ditrimethylolpropane tetra(meth)acrylate, ethylene oxide-added pentaerythritol tetra(meth)acrylate, ethylene oxide-added dipentaerythritol hexa(meth)acrylate, propylene oxide-added trimethylolpropane tri(meth)acrylate, propylene oxide-added ditrimethylolpropane tetra(meth)acrylate, propylene oxide-added pentaerythritol tetra(meth)acrylate, propylene oxide-added dipentaerythritol hexa(meth)acrylate, ε-caprolactone-added trimethylolpropane tri(meth)acrylate, ε-caprolactone-added ditrimethylolpropane tetra(meth)acrylate, ε-caprolactone-added pentaerythritol tetra(meth)acrylate, and ε-caprolactone-added dipentaerythritol hexa(meth)acrylate.

The above-described epoxy group or oxetanyl group-containing compounds are not particularly restricted as long as they have an epoxy group or an oxetanyl group in the respective molecules, and examples thereof include KBM303 and KBM403 (both of which are manufactured by Shin-Etsu Chemical Co., Ltd.); EPOLITE M-1230 and EPOLITE EHDG-L (both of which are manufactured by Kyoeisha Chemical Co., Ltd.); PP-101 (manufactured by Tohto Kasei Co., Ltd.); and NK OLIGO EA-1010/ECA (manufactured by Shin-Nakamura Chemical Co., Ltd.).

Examples of a compound having two epoxy groups or oxetanyl groups include EPOLITE 40E, EPOLITE 100E, EPOLITE 200E, EPOLITE 400E, EPOLITE 70P, EPOLITE 200P, EPOLITE 400P, EPOLITE 1500NP, EPOLITE 80MF, EPOLITE 4000 and EPOLITE 3002 (all of which are manufactured by Kyoeisha Chemical Co., Ltd.); NC6000 (manufactured by Nippon Kayaku Co., Ltd.); DENACOL EX-212L, DENACOL EX-214L, DENACOL EX-216L and DENACOL EX-850L (all of which are manufactured by Nagase ChemteX Corporation); CELLOXIDE 2021P (manufactured by Daicel Chemical Industries, Ltd.); GAN and GOT (both of which are manufactured by Nippon Kayaku Co, Ltd.); jER828, jER1002, jER1750, jER1007, YX8100-BH30, E1256, E4250 and E4275 (all of which are manufactured by Mitsubishi Chemical Corporation); BPFG, BPEFG and OGSOL PG100 (all of which are manufactured by Osaka Gas Chemicals Co., Ltd.); EPICLON EXA-9583 and HP4032 (both of which are manufactured by DIC Corporation); and EP-4088S, EP-4085S and EP-4080S (all of which are manufactured by ADEKA Corporation).

Examples of a compound having three epoxy groups or oxetanyl groups include VG3101 (manufactured by Mitsui Chemicals, Inc.); TEPIC S, TEPIC G and TEPIC P (which are manufactured by Nissan Chemical Industries, Ltd.); and DENACOL EX-321L (manufactured by Nagase ChemteX Corporation).

Examples of a compound having four or more epoxy groups or oxetanyl groups include EPOTOHTO YH-434L (manufactured by Tohto Kasei Co., Ltd.); EPPN502H, NC3000 and NC6000 (all of which are manufactured by Nippon Kayaku Co., Ltd.); and EPICLON N695 and HP7200 (both of which are manufactured by DIC Corporation).

Examples of the oxetanyl group-containing compound include 4,4-bis[(3-ethyl-3-oxetanyl)methyl]biphenyl, 3,7-bis(3-oxetanyl)-5-oxanonane, 3,3'-[1,3-(2-methylenyl)propanediylbis(oxymethylene)]bis(3-ethyloxetane), 1,4-bis[(3-ethyl-3-oxetanyl)methoxymethyl]benzene, 1,2-bis[(3-ethyl-3-oxetanyl)methoxymethyl]ethane, 1,3-bis[(3-ethyl-3-oxetanyl)methoxymethyl]propane, ethylene glycol-bis[(3-ethyl-3-oxetanyl)methyl]ether, dicyclopentenyl-bis[(3-ethyl-3-oxetanyl)methyl]ether, triethylene glycol-bis[(3-ethyl-3-oxetanyl)methyl]ether, tetraethylene glycol-bis[(3-ethyl-3-oxetanyl)methyl]ether, tricyclodecanediyldimethylene-bis[(3-ethyl-3-oxetanyl)methyl]ether, trimethylolpropane tris[(3-ethyl-3-oxetanyl)methyl]ether, 1,4-bis[(3-ethyl-3-oxetanyl)methoxy]butane, 1,6-bis[(3-ethyl-3-oxetanyl)methoxy]hexane, pentaerythritol tris[(3-ethyl-3-oxetanyl)methyl]ether, pentaerythritol tetrakis[(3-ethyl-3-oxetanyl)methyl]ether, polyethylene glycol-bis[(3-ethyl-3-oxetanyl)methyl]ether, dipentaerythritol hexakis[(3-ethyl-3-oxetanyl)methyl]ether, dipentaerythritol pentakis[(3-ethyl-3-oxetanyl)methyl]ether, and dipentaerythritol tetrakis[(3-ethyl-3-oxetanyl)methyl]ether.

The alkoxyalkyl group-containing compounds are not particularly restricted as long as they have an alkoxyalkyl group in the respective molecules, and examples thereof include alkoxyalkyl group-containing melamine compounds, alkoxyalkyl group-containing benzoguanamine compounds, alkoxyalkyl group-containing urea compounds, and alkoxyalkyl group-containing phenol compounds.

The above-described cross-linking agents may be used individually, or two or more thereof may be used.

From the standpoints of, for example, obtaining a composition having excellent photosensitivity and a partition wall showing only small changes in properties over a prolonged period of time, the content of the cross-linking agent(s) is preferably 5 to 80% by mass, more preferably 10 to 70% by mass, particularly preferably 15 to 60% by mass, with respect to 100% by mass of the photosensitive composition.

<Photoinitiator>

The above-described photoinitiator is not particularly restricted as long as it is a compound which leads to initiate polymerization by irradiating with light such as radiation, and a conventionally known compound can be used as the photoinitiator.

Examples of such a compound include 2,2'-bis(2,4-dichlorophenyl)-4,5,4',5'-tetraphenyl-1,2'-biimidazole, 2,2'-bis(2-chlorophenyl)-4,5,4',5'-tetraphenyl-1,2'-biimidazole, 2,2'-bis(2,4-dimethylphenyl)-4,5,4',5'-tetraphenyl-1,2'-biimidazole, 2,2'-bis(2-methylphenyl)-4,5,4',5'-tetraphenyl-1,2'-biimidazole, 2,2'-diphenyl-4,5,4',5'-tetraphenyl-1,2'-biimidazole, diethoxyacetophenone, 2-(dimethylamino)-2-[(4-methylphenyl)methyl]-1-[4-(4-morpholinyl)phenyl]-1-butanone, 2,2-dimethoxy-1,2-diphenylethane-1-one, benzoin, benzophenone, methyl o-benzoylbenzoate, 4-phenylbenzophenone, 4,4'-bis(diethylamino)benzophenone, 2-benzyl-2-dimethylamino-1-(4-morpholinophenyl)-butanone-1, 2-methyl-1-[4-(methylthio)phenyl]-2-morpholinopropane-1, 1-[9-ethyl-6-(2-methylbenzoyl)-9H-carbazol-3-yl]ethanone 1-(O-acetyloxime), 2,4,6-trimethylbenzoyl-diphenyl-phosphine oxide, bis(2,4,6-trimethylbenzoyl)-phenylphosphine oxide, 2,4-bis(trichloromethyl)-6-(4-methoxyphenyl)-1,3,5-triazine, and 2,4-bis(trichloromethyl)-6-(4-methoxynaphthyl)-1,3,5-triazine.

The above-described photoinitiators may be used individually, or two or more thereof may be used.

From the standpoints of, for example, obtaining a composition having excellent photosensitivity, the content of the photoinitiator(s) is preferably 0.1 to 20% by mass, more preferably 0.5 to 10% by mass, with respect to 100% by mass of the photosensitive composition. By controlling the content of the photoinitiator(s) in this range, the developability of the partition wall formed from the photosensitive composition tends to be improved without impairing the sensitivity.

In the photosensitive composition, other additives such as an organic solvent, an antioxidant, a thermal polymerization inhibitor, a surfactant, an adhesive assistant, a solubility modifier, a viscosity modifier, a filler (e.g., an inorganic filler) and a colorant can be further incorporated within a range that does not adversely affect the effects of the present invention.

Examples of the organic solvent include those described in JP-A-2006-201670, JP-A-2012-256023, JP-A-2014-013413 and the like.

Examples of the antioxidant include those described in JP-A-2010-117614, JP-A-2010-184961, JP-A-2013-241554 and the like.

Examples of the surfactant include those described in JP-A-2010-250109, JP-A-2014-089970, JP-A-2014-048428 and the like.

Examples of the adhesive assistant include those described in JP-A-2012-256023, JP-A-2013-242511, JP-A-2014-080578 and the like.

Examples of the inorganic filler include those described in JP-A-2007-332255, JP-A-2008-242076, JP-A-2012-198527, JP-A-2013-216737, JP-A-2014-062195 and the like.

Examples of other additives include those compounds that are described in JP-A-2006-154434, JP-A-2007-293306 and the like.

<Method of Preparing Photosensitive Composition>

The photosensitive composition can be prepared by, for example, mixing an alkali-soluble polymer, a cross-linking agent, a photoinitiator and other arbitrary additive(s). Further, in order to remove contaminants, after uniformly mixing these components, the resulting mixture may be subjected to filtration using a filter or the like.

[Method of Forming Partition Wall]

The method of forming the partition wall is not particularly restricted and, for example, a method of forming a partition wall by coating and curing the above-described photosensitive composition can be preferably employed.

Such a partition wall-forming method may be carried out directly on the first or second electrode layer stack, or it may be carried out on other support such as a glass support, a metal support or a resin support and the resulting partition wall may then be arranged on the first or second electrode layer stack; however, it is preferably carried out directly on an electrode layer stack having the above-described surface layer.

The method of forming the partition wall is not particularly restricted; however, specifically, the partition wall can be obtained by coating the photosensitive composition on the first or second electrode layer stack or other support, drying the coated photosensitive composition as required and then curing the photosensitive composition by irradiation with light. Here, by performing the irradiation with light (exposure) using a mask having a prescribed pattern, subsequently developing the photosensitive composition with an alkaline developer and, as required, heating the resultant, a partition wall of a desired shape such as a lattice shape can be obtained, and this enables to easily produce a display element having plural pixel regions that are formed by compartmentalizing the housing space with plural partition walls.

These processes can be carried out by a conventionally known method, examples of which include the method described in JP-A-2012-256023.

A surface, preferably both surfaces of the partition wall obtained by the above-described method may be further subjected to a surface treatment which, for example, hydrophilizes the surface(s) by a conventionally known hydrophilization method or hydrophobizes the surface(s) by a conventionally known hydrophobization method.

Examples of the hydrophilization treatment method include a method of modifying the surface of the obtained film by a corona discharge treatment, a plasma treatment or an UV-ozone treatment; and a method of layering a film comprising of an acrylic resin, a sulfonate group-containing resin or the like on the surface of the obtained film by coating or lamination.

Examples of the hydrophobization treatment method include a method of modifying the surface of the obtained film by treatment with a long-chain alkyl group-containing coupling agent, a fluorine-containing coupling agent or a silicon-containing coupling agent; and a method of layering a film comprising of a long-chain alkyl group-containing resin, a fluorine-containing resin, a silicon-containing resin or the like on the surface of the obtained film by coating or lamination.

For example, in cases where a film is formed from the photosensitive composition and the surface of the film is subjected to an UV-ozone treatment, the exposure dose in this treatment is preferably 0.1 to 8 J/cm$^2$ @ 254 nm, more preferably 0.5 to 5 J/cm$^2$ @ 254 nm, because, for example, this enables to easily obtain a partition wall having hydrophilicity, light resistance, heat resistance, chemical resistance and high hardness.

<First Electrode Layer Stack and Second Electrode Layer Stack>

The first and second electrode layer stacks are not particularly restricted; however, they are each preferably a stack (laminate) composed of a transparent material.

The first and second electrode layer stacks usually comprise: a transparent substrate made of glass or resin; and a transparent electroconductive layer composed of a transparent electroconductive material such as indium tin oxide (ITO).

When such electrode layer stacks are used, they are arranged such that their transparent electroconductive layer sides face with each other.

The first and second electrode layer stacks may further comprise other layer(s), for example, a conventionally known layer(s) such as a planarization film, a passivation film, a reflective film, an insulation film and/or a hydrophobic film, on the transparent substrate or transparent electroconductive layer or therebetween.

The first and second electrode layer stacks comprise the above-described layer(s) and, among these layers, a layer which exists on the surface in contact with the housing space and is in contact with the partition wall, the layer existing on the surface of at least one of the electrode layer stacks, is the surface layer of the present invention.

In the present invention, using a layer conforming to the properties desired in the resulting display element as the surface layer and taking into consideration the thermal linear expansion coefficient of this layer, a partition wall-forming composition may be prepared and a partition wall may be formed therefrom. Alternatively, using a partition wall conforming to the desired properties and taking into consideration the thermal linear expansion coefficient of this partition wall, the surface layer may be arranged on the surface of at least one of the electrode layer stacks.

It is preferred that the surface layer be a hydrophobic layer. The two surfaces of the first and second electrode layer stacks that are in contact with the housing space may both be hydrophobic layers; however, in that case, it is preferred that these surfaces have different levels of hydrophobicity, with the hydrophobicity of one of the surfaces being higher than that of the other surface.

In other words, in the display element of the present invention, it is preferred that the first and second electrode layer stacks have such hydrophobic layers that, when no voltage is applied between the first and second electrode layer stacks, allow the non-polar liquid to exist on the surface of at least one of the first and second electrode layer stacks that is in contact with the housing space.

An electrode layer stack having the above-described hydrophobic layer can be obtained by, for example, on the surface of a laminate comprising a transparent substrate and a transparent electroconductive layer, coating a hydrophobic material-containing composition to form a coating film or laminating a film composed of a hydrophobic material.

Examples of the hydrophobic material include fluorine-containing materials and silicon-containing materials, among which fluorine-containing materials are preferred.

Examples of the fluorine-containing materials include fluorocarbon polymers described in JP-A-2011-157292, JP-A-2010-121137, JP-A-2003-315308, Japanese Patent No. 4045253, JP-A-2013-142753, JP-T-2013-522669 and JP-A-2014-066835.

Further, as a fluorine-containing material, a product that is commercially available on the market may be used as well, and examples thereof include CYTOP manufactured by Asahi Glass Co., Ltd. (trade name: CTL-809M) and TEFLON (registered trademark) manufactured by DuPont Co. (trade name: AF1600 and AF2400).

<Housing Space>

The housing space may be a space of any size as long as it can contain a polar liquid and a non-polar liquid and does not interfere with the change in the state of the non-polar liquid based on the presence or absence of an applied voltage. The housing space can be selected as appropriate in accordance with the desired application as well as the size and the like of the pixel regions desired to be displayed.

<Polar Liquid>

The polar liquid is stored in the housing space. The polar liquid is not particularly restricted as long as it is immiscible with the non-polar liquid to be used; however, it is preferably an electroconductive liquid that is colorless and transparent. Specifically, as the polar liquid, in addition to water, an aqueous solution or the like in which an electrolyte such as lithium chloride, potassium chloride or sodium chloride is dissolved can be used.

As the polar liquid, two or more kinds of liquid may be used; however, a single kind of liquid is usually used.

<Non-Polar Liquid>

The non-polar liquid is also stored in the housing space. The non-polar liquid is not particularly restricted; however, it is preferably a liquid that is hardly polar and shows electrical insulation.

Examples of the non-polar liquid include hydrophobic liquids such as side-chain higher alcohols, side-chain higher fatty acids, alkane hydrocarbons such as octane and decane, and silicone oil.

As the non-polar liquid, two or more kinds of liquid may be used; however, a single kind of liquid is usually used.

The amount of the non-polar liquid to be stored in each pixel region (cell) can be adjusted as appropriate in accordance with the desired application; however, it is preferably, for example, such an amount that can cover the entire surface of the electrode layer stack on the display surface side of the display element.

The non-polar liquid used in the present invention is preferably a liquid having a color (colored liquid), particularly the above-described hydrophobic liquid in which a color material that can be dissolved or uniformly dispersed therein, such as a dye or a pigment, is blended. The colored liquid may be transparent or opaque.

Examples of the dye include those described in JP-A-2014-010249 and JP-A-2013-228683, and examples of the pigment include carbon blacks and pigments described in JP-A-2012-181513.

As the color material, one which allows the non-polar liquid to absorb light having a prescribed wavelength can be selected as appropriate in accordance with the desired application, and such a color material may be used individually, or two or more thereof may be used.

When the non-polar liquid contains a color material, the content thereof is not particularly restricted and can be adjusted as appropriate in accordance with the desired application; however, it is preferred that the color material be contained in such an amount that can be dissolved or uniformly dispersed in the hydrophobic liquid, for example, 0.01 to 30% by mass with respect to 100% by mass of the non-polar liquid.

Further, as required, the non-polar liquid may also contain a variety of additives, such as an ultraviolet absorber and an antioxidant, within a range that does not adversely affect the effects of the present invention.

<<Electrowetting Display>>

The electrowetting display of the present invention is not particularly restricted as long as it comprises the above-described display element of the present invention.

Since the electrowetting display of the present invention comprises the display element of the present invention, it has a long service life and excellent display properties.

The electrowetting display of the present invention can be produced by laminating conventionally known layers that have been used in conventional electrowetting displays, such as an insulation film, a thin-film transistor (TFT), a color filter layer and a black matrix, at the desired place in the desired order in accordance with the desired application. Such a constitution of the electrowetting display may be the same as, for example, the one described in JP-A-2013-142753 or JP-A-2012-63767, except that the display element of the present invention is used.

Particularly, it is preferred that the electrowetting display of the present invention contain a color filter layer because, for example, this enables to produce a display capable of performing full-color display on the display surface side at a low cost.

The color filter layer is not particularly restricted. The color filter layer is not restricted to a red, blue or green layer, and a layer having a color of cyan, magenta, yellow or the like can also be selected as appropriate in accordance with the desired application.

Further, the color filter layer can be arranged at any desired position in accordance with the desired application and, for example, when the electrowetting display of the present invention comprises a color filter layer and a TFT, the color filter layer may be arranged on the side of the display element of the present invention on which the TFT is laminated or on the opposite side thereof.

EXAMPLES

Embodiments of the present invention will now be described more concretely by way of examples thereof. However, the present invention is not restricted thereto by any means. It is noted here that, unless otherwise specified, "part(s)" and "%" are all based on mass.

The weight-average molecular weights (Mw) of the polymers obtained in the below-described Synthesis Examples were measured by gel permeation column chromatography under the following conditions.

Measurement method: gel permeation chromatography
Standard substance: polystyrene
Apparatus: manufactured by Tosoh Corporation, trade name: HLC-8020
Column: A column prepared by sequentially connecting Guard Column $H_{XL}$-H, TSK gel G7000$H_{XL}$, 2×TSK gel GMH$_{XL}$, and TSK gel G2000$H_{XL}$.
These columns are manufactured by Tosoh Corporation.
Solvent: tetrahydrofuran
Sample concentration: 0.7% by mass
Injection volume: 70 µL
Flow rate: 1 mL/min 1. Synthesis of Polymers

[Synthesis Example 1] Synthesis of Polymer (A1)

To a reaction vessel, 160 parts of propylene glycol monomethyl ether acetate (PGMEA) was loaded, and the temperature thereof was raised to 80° C. To the resulting reaction vessel, 13 parts of methacrylic acid, 46 parts of benzyl methacrylate, 13 parts of styrene, 16 parts of N-phenylmaleimide, 2 parts of n-butyl methacrylate and 10 parts of 2-hydroxyethyl methacrylate, which were used as monomers, and a solution obtained by mixing 5 parts of azobis-2,4-dimethylvaleronitrile as a polymerization catalyst and 25 parts of PGMEA as a solvent were each added dropwise over a period of 2 hours. Thereafter, the resulting mixed solution was heated at 80° C. for 2 hours and then at 100° C. for 1 hour. The thus heated mixed solution was allowed to cool to 23° C., thereby obtaining a PGMEA solution containing a polymer (A1) at a solid concentration of 35% by mass. The thus obtained polymer (A1) had a Mw of 12,000.

Synthesis Example 2

Synthesis of Polymer (A2)

To a reaction vessel, 90 parts of PGMEA was loaded, and the temperature thereof was raised to 80° C. To the resulting reaction vessel, a solution obtained by mixing 20 parts of methacrylic acid, 40 parts of benzyl methacrylate and 10 parts of 2-hydroxyethyl methacrylate as monomers with 15 parts of PGMEA as a solvent and a solution obtained by mixing 6 parts of azobis-2,4-dimethylvaleronitrile as a polymerization catalyst and 25 parts of PGMEA as a solvent were each added dropwise over a period of 2 hours. Thereafter, the resulting mixed solution was heated at 80° C. for 2 hours and then at 100° C. for 1 hour. After allowing the thus heated mixed solution to cool to 23° C., 30 parts of glycidyl methacrylate and 1 part of tetra-n-butylammonium chloride were further added, and the resultant was heated at 80° C. for 12 hours. The thus heated mixed solution was allowed to cool to 23° C., thereby obtaining a PGMEA solution containing a polymer (A2) at a solid concentration of 35% by mass. The thus obtained polymer (A2) had a Mw of 20,000.

[Synthesis Example 3] Synthesis of Polymer (A3) (Polyimide)

To a three-necked flask, 390 g of γ-butyrolactone (γ-BL) was added as a polymerization solvent, and 120 g of 2,2'-bis(3-amino-4-hydroxyphenyl)hexafluoropropane was added as a diamine compound to the polymerization solvent. After dissolving the diamine compound to the polymerization solvent, 71 g of 4,4'-oxydiphthalic dianhydride was added thereto as an acid dianhydride. Then, after allowing the resulting mixture to react at 60° C. for 1 hour, 19 g of maleic anhydride was added as an end-capping agent. The resultant was further allowed to react at 60° C. for 1 hour and then at an increased temperature of 180° C. for 4 hours, thereby obtaining about 600 g of γ-BL solution containing a polymer (A3) at a solid concentration of 35% by mass. The thus obtained polymer (A3) had a Mw of 8,000.

[Synthesis Example 4] Synthesis of Polymer (A4) (Polybenzoxazole Precursor)

To a four-necked separable flask equipped with a thermometer, a stirrer, a material inlet port and a dry nitrogen gas-introducing tube, 443.2 g (0.90 mol) of dicarboxylic acid derivative, which was obtained by allowing 1 mol of diphenyl ether-4,4'-dicarboxylic acid to react with 2 mol of 1-hydroxybenzotriazole, and 366.3 parts (1.00 mol) of hexafluoro-2,2-bis(3-amino-4-hydroxyphenyl)propane were loaded, and 3,000 parts of N-methyl-2-pyrrolidone was added and dissolved thereto. Then, using an oil bath, the resulting mixture was allowed to react at 75° C. for 16 hours. Thereafter, 32.8 parts (0.20 mol) of 5-norbornene-2,3-dicarboxylic acid anhydride dissolved in 100 parts of N-methyl-2-pyrrolidone was added, and the resulting mixture was further stirred for 3 hours and the reaction was terminated. After subjecting the reaction mixture to filtration, the cake was added to a solution of water and isopropanol (water/isopropanol=3/1 (mass ratio)), and the resulting precipitates were recovered by filtration, sufficiently washed with water and then dried under vacuum to obtain a polybenzoxazole precursor (polymer (A4)). By adding γ-BL thereto to a polymer (A4) concentration of 35% by mass, a γ-BL solution of the polymer (A4) was obtained. The thus obtained polymer (A4) had a Mw of 15,000.

[Synthesis Example 5] Synthesis of Polymer (A5) (Polysiloxane)

To a 500-mL three-necked flask, 63.39 parts (0.55 mol) of methyltrimethoxysilane, 69.41 parts (0.35 mol) of phenyltrimethoxysilane, 24.64 parts (0.1 mol) of 2-(3,4-epoxycyclohexyl)ethyltrimethoxysilane and 150.36 parts of propylene glycol monomethyl ether (PGME) were loaded and, while stirring the loaded materials at room temperature, an aqueous phosphoric acid solution prepared by dissolving 0.338 part of phosphoric acid (0.2% by mass with respect to the loaded monomers) in 55.8 parts of water was added over a period of 10 minutes. After stirring the resulting mixture for 1 hour with the flask being immersed in a 70° C. oil bath, the oil bath was heated to 115° C. over a period of 30 minutes. The inner temperature of the flask reached 100° C. one hour after the start of the heating and, from that point on, the flask was heated with stirring for 2 hours (the inner temperature of the flask was 100 to 110° C.). During the reaction, methanol and water, which were by-products, were distilled in a total of 115 parts. To the resulting PGME solution of polymer (A5), PGME was further added to a polymer (A5) concentration of 35% by mass, thereby obtaining a PGME solution of the polymer (A5). The thus obtained polymer (A5) had a Mw of 5,000 and a phenyl group content of 35 mol with respect to 100 mol of Si atoms.

The phenyl group content in the polymer (A5) was determined by measuring the $^{29}$Si-nuclear magnetic resonance spectrum of the polymer (A5) using "JNM-ECS 400" (manufactured by JEOL Ltd.) and calculating the ratio between the peak area of phenyl group-bound Si and that of Si not bound with a phenyl group.

[Synthesis Example 6] Synthesis of Polymer (A6) (Polyolefin)

To a nitrogen-substituted 1,000-mL autoclave, 60 parts of 8-carboxytetracyclo[4.4.0.1$^{2,5}$.1$^{7,10}$]dodeca-3-ene, 40 parts of N-phenyl-(5-norbornene-2,3-dicarboxyimide), 2.8 parts of 1,5-hexadiene, 0.05 part of (1,3-dimesitylimidazolidin-2-ylidene) (tricyclohexylphosphine) benzylidene ruthenium dichloride and 400 parts of PGMEA were loaded and, under stirring, the loaded materials were allowed to undergo polymerization reaction at 80° C. for 2 hours to obtain a polymer solution containing a polymer (A6').

To this polymer solution, 0.1 part of bis(tricyclohexylphosphine)ethoxymethylene ruthenium dichloride was added as a hydrogenation catalyst, and hydrogen was blown into the resulting solution for 5 hours at a pressure of 4 MPa to allow hydrogenation reaction to progress. Then, 1 part of powdered activated carbon was added and, under stirring, hydrogen was blown into the resulting solution for 3 hours at a temperature of 150° C. and a pressure of 4 MPa. Thereafter, the activated carbon was separated by filtration using a fluorocarbon resin-made filter having a pore size of 0.2 μm to obtain 490 parts of a hydrogenation reaction solution containing a polymer (A6), which is a hydride of the polymer (A6'). The thus obtained polymer (A6)-containing hydrogenation reaction solution had a solid concentration of 21% by mass and the yield of the polymer (A6) was 102 parts. This polymer (A6)-containing hydrogenation reaction solution was concentrated using a rotary evaporator to adjust the solid concentration to 35% by mass, thereby obtaining a solution of the polymer (A6). The thus obtained polymer (A6) had a Mw of 4,000.

[Preparation Example 7] Preparation of Polymer (A7) (Cardo Resin)

CR-TR5 (manufactured by Osaka Gas Chemicals Co., Ltd.), which is a PGME solution of a cardo resin, is a product having a solid content of 52.7% by mass and a solid acid value of 135 KOH mg/g. Here, 100 parts of CR-TR5 was weighed, 50.57 parts of PGME was added thereto, and the resultant was stirred. In this manner, a cardo resin (A7) solution having a solid concentration of 35% by mass was obtained.

[Synthesis Example 8] Synthesis of Polymer (A8) (Novolac Resin)

To a flask equipped with a thermometer, a condenser, a fractionating column and a stirrer, 94.1 g (1.0 mol) of phenol, 400 g of methyl isobutyl ketone, 96 g of water and 32.6 g (1.0 mol in terms of formaldehyde) of 92%-by-mass paraformaldehyde were loaded. Subsequently, while stirring the loaded materials, 3.4 g of p-toluenesulfonic acid was added thereto, and the resultant was allowed to react at 100° C. for 8 hours. After completion of the reaction, 200 g of pure water was added, and the resulting solution in the system was transferred to a separatory funnel to separate and remove the aqueous layer. Then, after washing the organic layer with water until the water after washing became neutral, the solvent was removed from the organic layer under heating and reduced pressure to obtain 140 g of a novolac resin (polymer (A8)). The thus obtained polymer (A8) had a Mw of 2,000. Using this polymer (A8) and PGMEA, a polymer (A8) solution having a solid concentration of 35% by mass was obtained.

From a measurement chart obtained using a Fourier-transform infrared (FT-IR) spectrophotometer, in comparison to the raw materials, absorption attributed to stretching caused by methylene bond (2,800 to 3,000 cm$^{-1}$) was confirmed; however, absorption attributed to aromatic ether (1,000 to 1,200 cm$^{-1}$) was not found. From these results, in this Synthesis Example, it can be determined that no dehydration-etherification reaction between hydroxyl groups (loss of hydroxyl groups) occurred and that a novolac resin having a methylene bond was obtained.

2. Preparation of Photosensitive Compositions for Formation of Partition Wall

Composition 1 in the form of a solution was obtained by mixing 100 parts (in terms of the polymer (A1)) of the polymer (A1) solution obtained in Synthesis Example 1, 50 parts of a cross-linking agent (B2), 5 parts of a photoinitiator (C), 5 parts of an adhesive assistant (D) and 1 part of a surfactant (E).

Compositions 2 to 14 were also obtained in the same manner by mixing the respective components in accordance with the formulations shown in Table 1 below. In the compositions 2 to 14 as well, the polymer solution obtained above was used such that each composition contained the polymer in the amount shown in Table 1. The details of each component in Table 1 are as shown in Table 2 below.

TABLE 1

|  |  | Composition 1 | Composition 2 | Composition 3 | Composition 4 | Composition 5 | Composition 6 | Composition 7 | Composition 8 | Composition 9 | Composition 10 | Composition 11 | Composition 12 | Composition 13 | Composition 14 |
|---|---|---|---|---|---|---|---|---|---|---|---|---|---|---|---|
| Polymer | A1 | 100 | 100 | 100 |  |  |  |  |  |  |  |  |  |  | 100 |
|  | A2 |  |  |  | 100 | 100 | 100 | 100 |  |  |  |  |  |  |  |
|  | A3 |  |  |  |  |  |  |  | 100 |  |  |  |  |  |  |
|  | A4 |  |  |  |  |  |  |  |  | 100 |  |  |  |  |  |
|  | A5 |  |  |  |  |  |  |  |  |  | 100 |  |  |  |  |
|  | A6 |  |  |  |  |  |  |  |  |  |  | 100 |  |  |  |
|  | A7 |  |  |  |  |  |  |  |  |  |  |  | 100 |  |  |
|  | A8 |  |  |  |  |  |  |  |  |  |  |  |  | 100 |  |
| Cross-linking agent | B1 | 0 | 0 | 0 | 50 | 100 | 100 | 100 | 100 | 100 | 100 | 100 | 100 | 100 | 30 |
|  | B2 | 50 | 70 | 100 | 50 | 0 | 0 | 0 | 0 | 0 | 0 | 0 | 0 | 0 | 0 |
| Photoinitiator | C | 5 | 5 | 4 | 6 | 6 | 6 | 6 | 6 | 6 | 6 | 6 | 6 | 6 | 5 |
| Adhesive assistant | D | 5 | 5 | 5 | 5 | 5 | 5 | 5 | 5 | 5 | 5 | 5 | 5 | 5 | 5 |
| Surfactant | E | 1 | 1 | 1 | 1 | 1 | 1 | 1 | 1 | 1 | 1 | 1 | 1 | 1 | 1 |
| Inorganic filler | F | 0 | 0 | 0 | 0 | 0 | 5 | 15 | 0 | 0 | 0 | 0 | 0 | 0 | 0 |

TABLE 2

B1  Dipentaerythritol hexaacrylate
B2  1,9-nonanediol diacrylate
C   1-[9-ethyl-6-(2-methylbenzoyl)-9H-carbazol-3-yl]ethanone 1-(O-acetyloxime) (trade name "IRGACURE Oxe02", manufactured by BASF)
D   Methacryloxypropyltrimethoxysilane (trade name "XIAMETER OFS-6030 SILANE", manufactured by Dow Corning Toray, Co., Ltd.)
E   Fluorine surfactant (trade name "FTX-218F", manufactured by Neos Co., Ltd.)
F   Zirconia particle (trade name "SZR-M", manufactured by Sakai Chemical Industry Co., Ltd.)

Example 1

3. Preparation of Partition Wall

Figure 2:
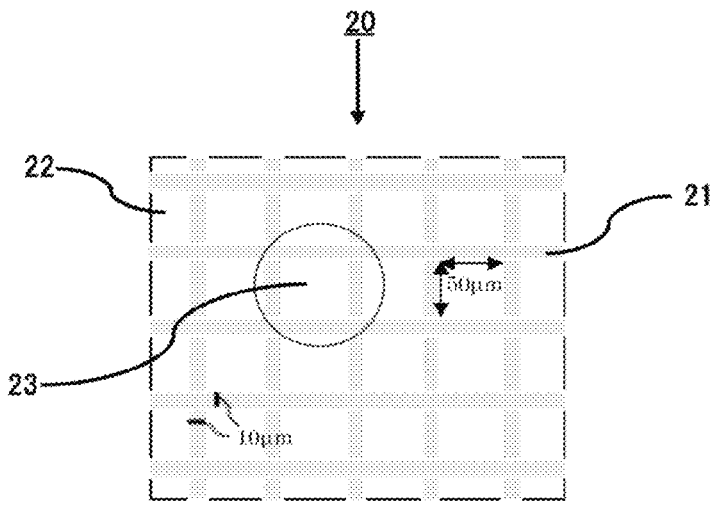
FIG. 2 is a schematic plan view showing a partition wall (lattice-patterned coating film) obtained in an Example.

On a 100 nm-thick ITO layer provided on one side of a glass wafer, the composition 1 shown in Table 1 was coated and then heat-treated at 110° C. for 5 minutes on a hot plate (pre-baking) to form a coating film of 25 to 35 µm in height (length in the direction corresponding to the vertical direction in FIG. 1). Using a stepper (model "NSR-2005i10D", manufactured by Nikon Corporation), the thus formed coating film was exposed through a patterned mask at the UV dose shown in Table 3. The thus exposed coating film was immersed in an aqueous solution containing 2.38% by mass of tetramethylammonium hydroxide for 90 seconds (development process) and subsequently washed with water. Then, after heat-treating the resulting coating film in an oven at 220° C. for 1 hour, the surface of the coating film was subjected to an UV-ozone treatment by a low-pressure mercury lamp (exposure dose: 3 J/cm²@ 254 nm) using a table-top light surface processor (trade name: PL16-110, manufactured by SEN Lights Co., Ltd.), thereby preparing a partition wall (lattice-patterned coating film) having a line width of 10 µm, a lattice spacing of 50 µm and a height (length in the direction corresponding to the vertical direction in FIG. 1) of 20 µm. The plan view of the thus obtained partition wall (lattice-patterned coating film) is shown in FIG. 2.

It is noted here that, in the present invention, the value of exposure dose (J/cm² @ 254 nm) is the dose of the irradiated ultraviolet radiation that was converted into the amount of light having a wavelength of 254 nm and the value of exposure dose (mJ/cm² @ 365 nm) is the dose of the irradiated ultraviolet radiation that was converted into the amount of light having a wavelength of 365 nm.

4. Preparation of Display Element

A partition wall having a height (length in the direction corresponding to the vertical direction in FIG. 1) of 20 µm, a line width of 10 µm and a lattice spacing of 50 µm was formed in the same manner as in the above "3. Preparation of Partition Wall", except that a 0.7 mm-thick glass plate having a 100 nm-thick ITO layer on one side and a 450 µm-thick hydrophobic film thereon (amorphous fluorine-containing polymer "AF1600", manufactured by DuPont Co.) was used as a substrate and the composition 1 shown in Table 1 was coated on the hydrophobic film of this substrate. An colored oil (liquid obtained by dissolving 0.1 wt % of Sudan Black B (manufactured by Wako Pure Chemical Industries, Ltd.) in octane) was injected to each compartment (cell) surrounded by the thus formed partition wall, and the resulting partition wall-equipped substrate was placed in water. Then, a glass plate 2 having a 100 nm-thick ITO layer on one side ("20Ω", manufactured by Nippon Sheet Glass Co., Ltd.) was arranged such that the ITO layer of the glass plate 2 is provided on the side of the partition wall-equipped substrate and in contact with the partition wall. Thereafter, by sealing the contact portion between the partition wall and the ITO layer of the glass plate 2 with a photo-curable epoxy adhesive, a display element having not less than 100 cells in the center of the substrate was prepared.

Examples 2 to 13 and Comparative Example 1

A partition wall and a display element were each prepared in the same manner as in Example 1, except that the respective composition shown in Table 3 or 4 was used and the UV irradiation was performed at the respective exposure dose shown in Table 3 or 4.

5. Evaluations

The partition walls and display elements obtained in Examples and Comparative Example were evaluated by the following methods. The results thereof are shown in Table 3 or 4.

5-1. Shape

For each of the partition walls obtained in the above-described Examples and Comparative Example, the cross-sectional shape was observed under an electron microscope, and the height of the partition wall (length corresponding to the vertical direction in FIG. 1), the width of the partition wall in contact with the ITO layer (base width) and the width of the partition wall on the side opposite to the side in contact with the ITO layer (top width) were measured under an SEM (model "S-4200", manufactured by Hitachi High-Technologies Corporation).

It is noted here that the height of each partition wall was measured at 5 arbitrary points and an average thereof is shown in Table 3 or 4. Further, using the standard deviation, 6, of the measurements taken at the 5 points, the in-plane uniformity of the height of the partition wall was evaluated using the following equation:

Height in-plane uniformity($3\sigma$)=$3\times\sigma$ 5-2. Evaluation of Thermal Linear Expansion Coefficient For each of the partition walls obtained in the above-described Examples and Comparative Example, a film piece of 20 μm in thickness, 10 mm in length and 10 mm in width was fixed upright in a TMA (thermal Mechanical Analysis) SS6100 apparatus (manufactured by Seiko Instruments Inc.), and a load of 1 g was applied thereto using a probe. In order to eliminate the thermal history of the film, after once heating the film from room temperature to 200° C. at a rate of 5° C./min, the film was cooled and again heated from room temperature at a rate of 5° C./rain. Then, a graph showing the relationship between the thus obtained results and the temperature was prepared. The thermal linear expansion coefficient was determined from the slope of the thus obtained graph between 50° C. and 150° C.

5-3. Evaluation of Difference in Thermal Linear Expansion Coefficient

The difference in thermal linear expansion coefficient was evaluated using the following equation.

Difference in thermal linear expansion coefficient= (Thermal linear expansion coefficient of each partition wall obtained in Examples and Comparative Example)–(Thermal linear expansion coefficient of surface layer)

It is noted here that the thermal linear expansion coefficient of the above-described 450 μm-thick hydrophobic film (amorphous fluorine-containing polymer "AF1600", manufactured by DuPont Co.) was measured in the same manner as in the above "5-2. Evaluation of Thermal Linear Expansion Coefficient", except that a film made of the polymer "AF1600" having a thickness of 20 μm, a length of 10 mm and a width of 10 mm was used. This film had a thermal linear expansion coefficient of 100 ppm/K.

Further, the thermal linear expansion coefficient of the above-described 100 nm-thick ITO layer was determined using an ITO layer-equipped glass substrate ("20Ω", manufactured by Nippon Sheet Glass Co., Ltd.). The thermal linear expansion coefficient of the ITO layer was calculated as a difference between the thermal linear expansion coefficient of the ITO layer-equipped glass substrate ("20Ω") and that of the glass plate of the "20Ω" from which the ITO layer was detached, which values were measured in the same manner as in the above "5-2. Evaluation of Thermal Linear Expansion Coefficient". The thermal linear expansion coefficient of the ITO layer was found to be 10 ppm/K.

5-4. Outer Appearance

Using a heat cycler (TSA-40L, manufactured by Tabai Espec Co., Ltd.), each of the display elements obtained in Examples and Comparative Example was cooled to –40° C. at a cooling rate of 2° C./min and retained at –40° C. for 10 minutes, followed by heating to 100° C. at a heating rate of 2° C./min and subsequent retention at 100° C. for 10 minutes. Taking this process as 1 cycle, the cycle was repeated 100 times. Then, the partition wall and the part of the surface layer in contact therewith (hydrophobic film or ITO layer) were observed under a microscope. A case where cracking or detachment occurred between the partition wall and the surface layer was evaluated as "presence of cracking", whereas a case where neither cracking nor detachment occurred was evaluated as "no cracking".

5-5. Evaluation of Operational State of Display Element

For each of the display elements obtained in Examples and Comparative Example, a direct-current voltage of 10 V/10 μm intervals was applied between the pair of ITO layers sandwiching the partition wall, colored oil and water. In 100 cells that were formed on the substrate center of each display element obtained in Examples, the application of the voltage caused contraction of the colored oil (change into a hemispherical shape), making the backside transparent and, when the application of the voltage was terminated, color display was restored in all of the cells.

Taking application of the above-described direct-current voltage and termination of the application as 1 cycle, the cycle was repeated 100 times. Thereafter, in a condition where the application of the voltage was terminated, a case where defective color display did not occur in more than 80% of the cells was judged as "good" operational state of the display element; a case where defective color display occurred in not less than 20% to less than half of the cells was judged as "rather good" operational state of the display element; and a case where defective color display occurred in not less than half of the cells was judged as "poor" operational state of the display element.

TABLE 3

| | | Example 1 | Example 2 | Example 3 | Example 4 | Example 5 | Example 6 | Example 7 |
|---|---|---|---|---|---|---|---|---|
| Photosensitive composition for formation of partition wall | | Composition 1 | Composition 2 | Composition 3 | Composition 4 | Composition 5 | Composition 6 | Composition 7 |
| Exposure dose of prebaked coating film (mJ/cm² @ 365 nm) | | 330 | 350 | 350 | 300 | 300 | 250 | 250 |
| Shape of partition wall | Height (μm) | 20 | 20 | 20 | 20 | 20 | 20 | 20 |
| | Height in-plane uniformity ($3\sigma$) | 0.25 | 0.21 | 0.16 | 0.16 | 0.16 | 0.16 | 0.16 |
| | Top width (μm) | 8 | 9 | 8 | 10 | 8 | 9 | 9 |
| | Base width (μm) | 9 | 10 | 11 | 10 | 9 | 9 | 9 |
| Partition wall property | Thermal linear expansion coefficient of partition wall (ppm/K) | 140 | 120 | 100 | 80 | 60 | 40 | 20 |

TABLE 3-continued

|  |  |  | Example 1 | Example 2 | Example 3 | Example 4 | Example 5 | Example 6 | Example 7 |
|---|---|---|---|---|---|---|---|---|---|
| Display element | Difference in thermal linear expansion coefficient | Hydrophobic layer | 40 | 20 | 0 | −20 | −40 | −60 | −80 |
|  |  | ITO layer | 130 | 110 | 90 | 70 | 50 | 30 | 10 |
|  | Outer appearance |  | no cracking | no cracking | no cracking | no cracking | no cracking | no cracking | no cracking |
| Element property | Operational state | Reliability | rather good | rather good | good | good | good | good | good |

TABLE 4

|  |  |  | Example 8 | Example 9 | Example 10 | Example 11 | Example 12 | Example 13 | Comparative Example 1 |
|---|---|---|---|---|---|---|---|---|---|
| Photosensitive composition for formation of partition wall |  |  | Composition 8 | Composition 9 | Composition 10 | Composition 11 | Composition 12 | Composition 13 | Composition 14 |
| Exposure dose of prebaked coating film (mJ/cm² @ 365 nm) |  |  | 300 | 300 | 300 | 300 | 300 | 300 | 360 |
| Shape of partition wall | Height (μm) |  | 20 | 20 | 20 | 20 | 20 | 20 | 20 |
|  | Height in-plane uniformity (3σ) |  | 0.16 | 0.21 | 0.16 | 0.16 | 0.25 | 0.25 | 0.86 |
|  | Top width (μm) |  | 10 | 10 | 10 | 9 | 9 | 10 | 7 |
|  | Base width (μm) |  | 10 | 10 | 11 | 9 | 10 | 10 | 9 |
| Partition wall property | Thermal linear expansion coefficient of partition wall (ppm/K) |  | 40 | 40 | 40 | 60 | 60 | 60 | 180 |
| Display element | Difference in thermal linear expansion coefficient | Hydrophobic layer | −60 | −60 | −60 | −40 | −40 | −40 | 80 |
|  |  | ITO layer | 30 | 30 | 30 | 50 | 50 | 50 | 170 |
|  | Outer appearance |  | no cracking | no cracking | no cracking | no cracking | no cracking | no cracking | presence of cracking |
| Element property | Operational state | Reliability | good | good | good | good | good | good | poor |

6. Evaluation Results

It was confirmed that, in the display elements obtained in Examples 1 to 13, defective color display did not occur in not less than half of the cells even after the above-described cycle was repeated 100 times. Particularly, in the display elements obtained in Examples 3 to 13, even after the cycle was repeated 100 times, defective color display did not occur in more than 80% of the cells. In other words, it was found that the display elements obtained in Examples are capable of smoothly and stably changing the state of the colored oil (non-polar liquid) for a prolonged period of time.

Furthermore, the use of such a composition allowing the resulting partition wall to have a thermal linear expansion coefficient in the above-described range enabled to easily obtain, for example, a partition wall having excellent height in-plane uniformity; therefore, it was found that a partition wall of a desired shape can be thereby easily formed.

Meanwhile, in the evaluation of the operational state of the display element obtained in Comparative Example 1, abnormality was observed in the change (contraction behavior) of the colored oil into a substantially hemispherical shape when the application of voltage was terminated, and defective color display occurred in not less than half of the cells; therefore, poor evaluation was given.

DESCRIPTION OF SYMBOLS

10: Display element
11: First electrode layer stack
12: Second electrode layer stack
13: Partition wall
14: Non-polar liquid
15: Polar liquid
16: Housing space (pixel region (cell))
20: Partition wall formed on ITO layer
21: Partition wall
22: ITO layer
23: Cell

The invention claimed is:

1. A display element, comprising:
a first electrode layer stack;
a second electrode layer stack, the first electrode layer stack and the second electrode layer stack facing each other to form a housing space therebetween;
a partition wall compartmentalizing said housing space;
a polar liquid and a non-polar liquid each disposed in the housing space and being immiscible with each other; and
a surface layer provided on a surface of at least one of the first and second electrode layer stacks and being in contact with said partition wall and in contact with at least one of the polar liquid and the non-polar liquid,
wherein a material of said partition wall and a material of said surface layer are selected such that an absolute value of a difference in thermal linear expansion coefficient between said partition wall and said surface layer is adjusted to 150 ppm/K or less.

2. The display element according to claim 1, wherein said partition wall has a thermal linear expansion coefficient of from 0.1 to 150 ppm/K.

3. The display element according to claim 1, wherein said partition wall is a film obtained from a photosensitive composition.

4. The display element according to claim 1, wherein said partition wall is a film obtained from a negative photosensitive composition.

5. The display element according to claim 4, wherein said negative photosensitive composition comprises an alkali-soluble polymer, a cross-linking agent and a photoinitiator.

6. The display element according to claim 5, wherein said cross-linking agent is at least one compound selected from the group consisting of an ethylenically unsaturated group-containing compound, an epoxy group or oxetanyl group-containing compound and an alkoxyalkyl group-containing compound.

7. The display element according to claim 5, wherein said alkali-soluble polymer comprises at least one functional group selected from the group consisting of a carboxyl group, a phenolic hydroxyl group and a silanol group.

8. The display element according to claim 5, wherein said alkali-soluble polymer is at least one polymer selected from the group consisting of an acrylic resin, a polyimide, a polybenzoxazole, a polysiloxane, a polyolefin, a cardo skeleton-containing resin and a novolac resin.

9. The display element according to claim 5, wherein said alkali-soluble polymer has a weight-average molecular weight of from 1,000 to 100,000.

10. An electrowetting display, comprising the display element according to claim 1.

11. The electrowetting display according to claim 10, further comprising a color filter layer.

12. The display element according to claim 1, wherein the partition wall has the thermal linear expansion coefficient of from 0.1 to 100 ppm/K.

13. The display element according to claim 12, wherein the material of said partition wall and the material of said surface layer are selected such that the absolute value of the-difference in thermal linear expansion coefficient between said partition wall and said surface layer is adjusted to 100 ppm/K or less.

14. The display element according to claim 12, wherein the partition wall comprises at least one polymer selected from the group consisting of an acrylic resin, a polyimide, a polybenzoxazole, a polysiloxane, a polyolefin, a cardo skeleton-containing resin and a novolac resin, and the surface layer comprises a fluorine-containing material.

15. The display element according to claim 14, wherein the material of said partition wall and the material of said surface layer are selected such that the absolute value of the difference in thermal linear expansion coefficient between said partition wall and said surface layer is adjusted to 100 ppm/K or less.

16. The display element according to claim 12, wherein the partition wall comprises at least one polymer selected from the group consisting of a cross-linked acrylic resin, a cross-linked polyimide, a cross-linked polybenzoxazole, a cross-linked polysiloxane, a cross-linked polyolefin, a cross-linked cardo skeleton-containing resin and a cross-linked novolac resin, and the surface layer comprises a fluorine-containing material.

17. The display element according to claim 16, wherein the material of said partition wall and the material of said surface layer are selected such that the absolute value of the-difference in thermal linear expansion coefficient between said partition wall and said surface layer is adjusted to 100 ppm/K or less.

18. A photosensitive composition for forming a partition wall of a display element, the display element comprising a first electrode layer stack and a second electrode layer stack which face each other to form a housing space therebetween, said partition wall compartmentalizing the housing space, a polar liquid and a non-polar liquid each disposed in the housing space and being immiscible with each other, and a surface layer provided on a surface of at least one of the first and second electrode layer stacks and being in contact with said partition wall and in contact with at least one of the polar liquid and the non-polar liquid, wherein components of said photosensitive composition and a material of said surface layer are selected such that an absolute value of a difference in thermal linear expansion coefficient between said partition wall and said surface layer is adjusted to 150 ppm/K or less.

19. The photosensitive composition according to claim 18, which is a negative composition comprising an alkali-soluble polymer, a cross-linking agent and a photoinitiator.

* * * * *